United States Patent [19]

Belani

[11] 4,411,735
[45] Oct. 25, 1983

[54] POLYMERIC INSULATION LAYER ETCHING PROCESS AND COMPOSITION

[75] Inventor: Jagdish G. Belani, Cupertino, Calif.

[73] Assignee: National Semiconductor Corporation, Santa Clara, Calif.

[21] Appl. No.: 375,575

[22] Filed: May 6, 1982

[51] Int. Cl.³ ............... B44C 1/72; C03C 15/00; C03C 25/06
[52] U.S. Cl. ............... 156/659.1; 156/644; 156/668; 252/79.5; 430/317
[58] Field of Search ............... 427/88, 89, 90, 91, 427/307; 252/79.1, 79.5, 156; 156/630, 633, 644, 655, 659.1, 668; 430/313, 317, 323, 329

[56] References Cited

U.S. PATENT DOCUMENTS 3,700,497 10/1972 Epifano et al. ............... 427/89
3,871,930 3/1975 Fish ............... 156/630
4,039,371 8/1977 Brunner et al. ............... 156/668

OTHER PUBLICATIONS

IBM Technical Disclosure Bulletin, vol. 21, No. 9, Feb. 1979, Selective Etching of Polyimides and Polyamides by L. P. Brown et al., p. 3573.

Primary Examiner—William A. Powell
Attorney, Agent, or Firm—Willis E. Higgins

[57] ABSTRACT

In a process for fabricating semiconductor devices having a patterned polyimide (PI) or polyimide-isoindroquinazalinedione (PIQ) insulating layer on the device, a layer of uncured PI or PIQ resin is applied on a surface of the device. The resin layer is heated to produce a first level of partial curing in the resin layer. A photoresist is applied to the partially cured resin layer where it is to be removed. The partially cured resin layer is etched to produce the patterned layer. The patterned layer is then heated to produce a second level of partial cure, sufficient to prevent organic photoresist strippers from attacking the patterned layer. The developed photoresist is then stripped with an organic photoresist stripper, and the patterned layer heated a third time a sufficient extent to complete the curing of the PI and PIQ resin. The process desirably uses etching compositions comprising an amine etchant having the formula R—CH$_2$—CH$_2$—NH$_2$, where R is an alkyl group having from 1 to 4 carbon atoms or an aryl group having from 6 to 12 carbon atoms, or an etchant comprising a mixture of quaternary ammonium hydroxide and an N-alkyl-pyrrolidinone. In both cases, water may be used as a solvent for the etching compositions.

17 Claims, 3 Drawing Figures

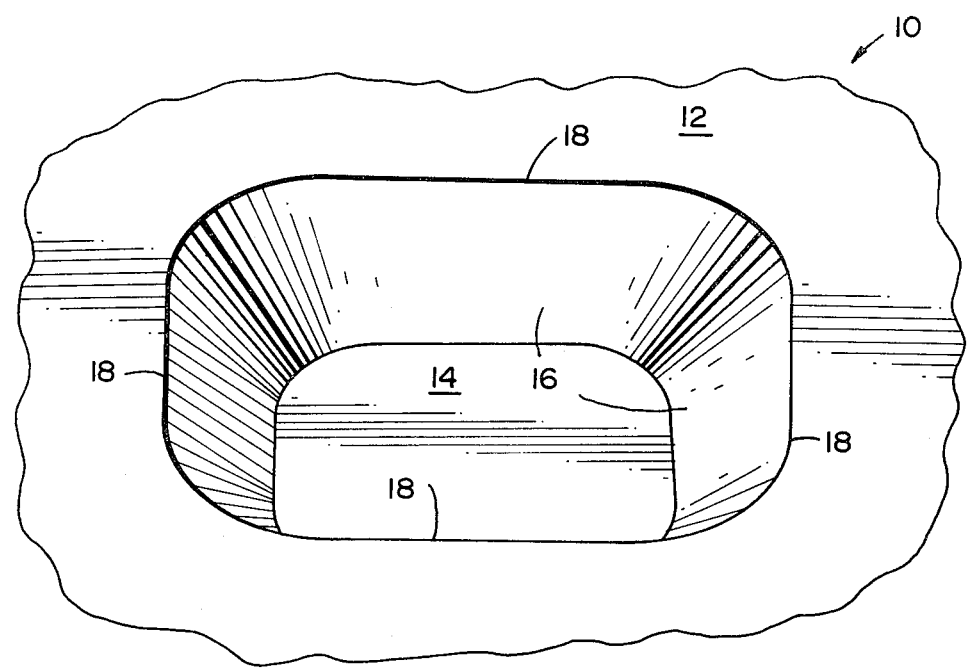
FIG. 1
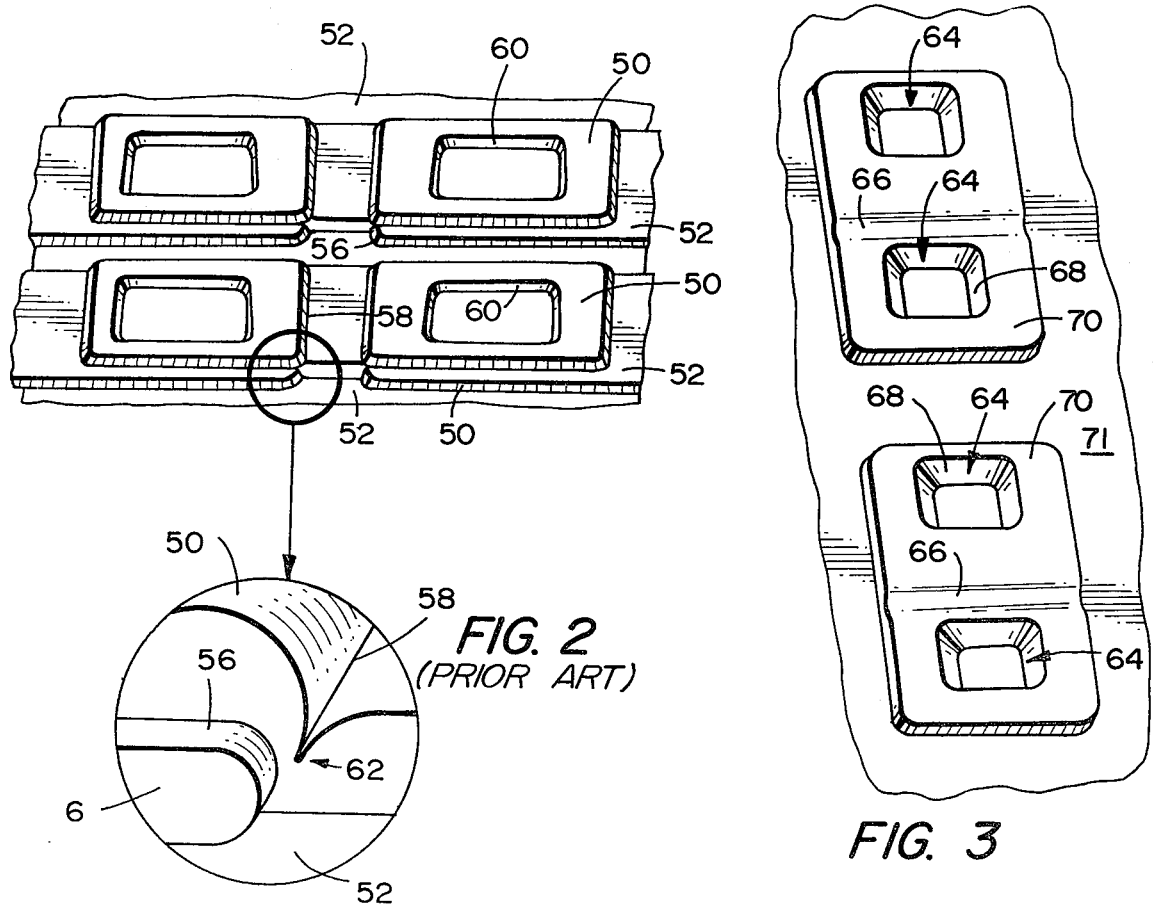
FIG. 2
(PRIOR ART)
FIG. 3

POLYMERIC INSULATION LAYER ETCHING PROCESS AND COMPOSITION

BACKGROUND OF THE INVENTION

1. Field of the Invention

This invention relates to an etching process and composition for forming patterns in a polyimide or similar polymeric insulating layer on a semiconductor device. More particularly, it relates to an improved process for etching such patterns which will allow either a positive or a negative photoresist to be used to define the patterns to be etched, and which does not require the use of hazardous materials or temperatures in the etching process.

2. Description of the Prior Art

The use of polyimide and related polymers as insulating materials for flexible printed circuits and similar applications is now well known. In the fabrication of such printed circuits, it is necessary to both bond a polyimide film to a copper film and to etch openings in the polyimide for contacting the copper film. A wide variety of inorganic and organic bases and amines have been used in the prior art, both as surface treatments for the polyimide film prior to bonding it to the copper, and as etchants for forming openings in the polyimide film after bonding to the copper. Examples of such surface treatment and etching processes and compositions are disclosed in U.S. Pat. Nos. 3,361,589; 3,770,528; 3,791,848; and 3,871,930.

More recently, it has also become known to utilize polyimide and related polymers, such as polyimide-iso-indroquinazolinedione to form insulating layers on semiconductor devices, such as integrated circuits. It is also necessary to form contact openings through such polyimide insulating layers in integrated circuits. In contrast to the printed circuit application, many of the openings in the insulating layers employed in integrated circuits are much smaller, such as 4 microns or less. Such small openings must often be be formed simultaneously with larger openings which will allow bonding pads to contact underlying aluminum metallurgy in the integrated circuits. Because the aluminum metallurgy is itself fairly thin, care must be made not to use an etchant for the polyimide insulating layer which will also attack the underlying aluminum. The need to avoid attack on the aluminum and the need to etch both very small holes and larger holes simultaneously with accurate definition means that many of the etchants employed for etching polyimide in flexible printed circuits are not suitable for use in etching polyimide insulating layers on integrated circuits.

One approach that has been suggested to avoid the problem of attacking aluminum metalization in integrated circuits is to etch openings in polyimide through the use of oxygen plasma, for example, as employed to strip photoresist from integrated circuits. In one such process, the oxygen plasma removes photoresist having a pattern of openings developed in it to define areas of the polyimide where etching is desired at the same time that the polyimide is etched where it is exposed. Such a process is described in U.S. Pat. No. 3,767,490. Another approach taught in the prior art for etching patterns in polyimide insulating layers of integrated circuits is to use an etching solution consisting of hydrazine and a diamine for either partially cured polyimides or fully cured polyimides. Such processes are described in U.S. Pat. Nos. 4,113,550 and 4,218,283. However, hydrazine is a very hazardous material, and most manufacturers of integrated circuits are reluctant to employ it. As a result, there has been a tendency to employ inorganic and organic bases as etchants, even though they are prone to attack aluminum. It has been difficult to etch different sized openings simultaneously with such etchants and the slope of openings etched with such etchants has tended to be non-uniform. Such processes also often employ an elevated temperature, which tends to increase the hazard of an otherwise acceptable etchant.

Thus, there is a need for further development of etching processes and compositions for forming openings in polyimide and related polymer insulating layers on integrated circuits.

SUMMARY OF THE INVENTION

Accordingly, it is an object of this invention to provide a process for etching patterns in a polyimide or polyimide-iso-indroquinazolinedione (hereafter PI or PIQ) insulating layer of a semiconductor device in which a negative photoresist may be used.

It is another object of the invention to provide such a process in which the PI or PIQ patterns are not attacked by organic photoresist stripper used to remove the negative photoresist.

It is still another object of the invention to provide a process for etching patterns in a PI or a PIQ insulating layer on a semiconductor device which does not require the use of a hazardous etchant.

It is a still further object of the invention to provide such a process which does not require the use of an elevated etching temperature.

It is yet another object of the invention to provide a novel etchant composition for etching patterns in a PI or PIQ insulating layer of a semiconductor device which will reproducibly etch different sized openings simultaneously in the insulating layers within the same etch times.

It is still another object of the invention to provide an etching process and composition for PI or PIQ insulating layers on semiconductor devices which will give a uniform slope to walls of etched openings, and control the angle of the slope.

The attainment of these and related objects may be achieved through use of the novel etching process and etching composition herein disclosed. The process of this invention is used in the fabrication of a semiconductor device having a patterned PI or PIQ insulating layer on the device. To carry out the process, a layer of uncured PI or PIQ resin is applied on a surface of the device. The resin layer is then heated to produce a first level of partial curing in the resin layer. A photoresist is then applied to the partially cured resin layer and developed to uncover the partially cured resin layer where it is to be removed. The partially cured resin layer is then etched to produce the patterned layer. The patterned layer is heated to produce a second level of partial curing, which is sufficient to prevent organic photoresist strippers from attacking the patterned layer. The photoresist is then stripped from the patterned layer with an organic photoresist stripper. The patterned PI or PIQ layer is then further heated a sufficient extent to complete the curing of the resin. It is preferred that the heating to produce the first level of partial curing in the resin layer be at a temperature from about 120° to about 150° C., for a time sufficient to remove solvent from the resin, which may be for a time of from a few minutes to about one hour. The heating to produce the second level of curing in the patterned layer prior to stripping the photoresist is carried out at a temperature of about 180° C. to about 220° C. for a time of from about 15 minutes to about several hours, with a temperature of about 200° C. for about 30 minutes being especially preferred. The final curing of the patterned layer after stripping the photoresist is completed at a temperature of at least about 300° C., again for a time of from about 15 minutes to several hours.

The two step partial curing of the PI or PIQ resin in the above process allows a negative photoresist, which has superior adhesion to the PI or PIQ resin layer when compared with positive photoresist, to be used. The second level of partial curing allows the negative photoresist to be stripped with conventional organic stripping compositions employed with negative photoresist, without attacking the underlying patterned PI or PIQ layer. However, the process may also be used with positive photoresists.

Conventional inorganic or organic base etchants for the PI or PIQ resin may be employed in the above process, such as an alkali metal hydroxide or a quaternary ammonium hydroxide. However, in a preferred embodiment of the above process, novel amine etching compositions of this invention are also employed, both because they do not attack an underlying aluminum interconnection layer of the semiconductor device, and because they produce more reproducible etching of different sized openings than alkali metal hydroxide etchants. Alternatively quaternary ammonium hydroxide-N-alkyl pyrrolidinone etching compositions of this invention may be employed, which allow etching of different size openings simultaneously, with the same etch times, although these etching compositions do attack aluminum.

An etchant composition in accordance with the invention for forming patterns in a PI and PIQ insulating layer of a semiconductor device comprises a water solution of an amine etchant having the formula $R—CH_2—CH_2—NH_2$, wherein R is alkyl group having from 1 to 4 carbon atoms or an aryl group having from 6 to 12 carbon atoms. Alternatively, the water solution may contain a mixture of a quaternary ammonium hydroxide and an N-alkyl pyrrolidinone. Preferred amines in accordance with the above formula are phenethylamine and n-propylamine. The preferred quaternary ammonium hydroxide is tetramethylammonium hydroxide. The preferred N-alkyl pyrrolidinone is N-methyl pyrrolidinone. The amine etchants are preferably provided in a substantially equimolar solution with water. The quaternary ammonium hydroxide and N-alkyl pyrrolidinone etchant is preferably provided as substantially equal parts by volume of a solution containing from about one to ten weight percent quaternary ammonium hydroxide in water and the N-alkyl pyrrolidinone. In the case of the preferred phenethylamine etchant, a variation of about ±15 percent of the equimolar proportions of phenethylamine and water is operable. Thus, the solution may contain from about 85 weight percent to about 90 weight percent phenethylamine and about 10 to about 15 weight percent water. In the case of the preferred n-propylamine etchant, a variation of about ±10 percent of the equimolar proportions of n-propylamine and water is operable. Thus, the solution may contain from about 75 weight percent to about 78 weight percent n-propylamine and from about 22 to about 25 weight percent water.

In use, the etchant compositions of this invention may either be employed with the above described two step partial curing process of this invention, or in a conventional partial curing process as described in U.S. Pat. No. 4,113,550, in place of the hydrazine-ethylene diamine etchant there disclosed. The etching may be carried out at room temperature. The above described phenethylamine etchants give openings with uniformly sloped 45° angle sidewalls, the n-propylamine etchants give 90° straight sidewalls, while the quaternary ammonium hydroxide-N-alkyl pyrrolidinone etchants give openings with uniformly sloped 60°–65° angle sidewalls.

The attainment of the foregoing and related objects, advantages and features of the invention should be more readily apparent to those skilled in the art after review of the following more detailed description of the invention, taken together with the drawings, in which:

BRIEF DESCRIPTION OF THE DRAWINGS

FIG. 1 is a perspective view of a structure obtained through practice of the invention.

FIG. 2 is an example of a typical structure obtained through use of a prior art semiconductor device fabrication process.

FIG. 3 is a perspective view of another semiconductor device structure obtained through practice of the present process.

DETAILED DESCRIPTION OF THE INVENTION

Turning now to the drawings, more particularly to FIG. 1, there is shown a via hole 10 etched using the process and etching composition of this invention. The via hole 10 is formed in a PIQ layer 12 to expose an aluminum layer 14 forming part of interconnection metallurgy in an integrated circuit, for the purpose of making electrical contact to the aluminum layer 14. Sidewalls 16 of the via hole 10 have a 45° slope, produced by the phenethylamine etching composition of this invention. The dimensions of the via hole 10 are approximately 10 microns between opposing edges 18. FIGS. 1, 2 and 3 of this application are drawn from scanning electron microscope photographs of actual devices fabricated using the invention.

PI resins suitable for use with the present invention are known in the art, and desirably have the formula:

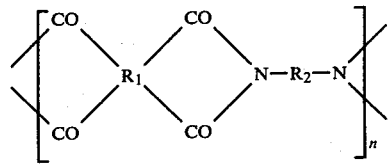

wherein $R_1$ and $R_2$ are radicals of a tetravalent aromatic group, and N is a positive integer. Resins of this type may be prepared as a condensation product of an aromatic dicarboxylic dianhydride with an aromatic diamine. Such resins and processes for preparing them are further described in U.S. Pat. No. 3,179,634, and are commercially available from E. I. DuPont de Nemours & Company, Wilmington, Del., under the trademark "Pyre-ML."

PIQ resins suitable for practice of the invention are also known in the art, and desirably have the formula:

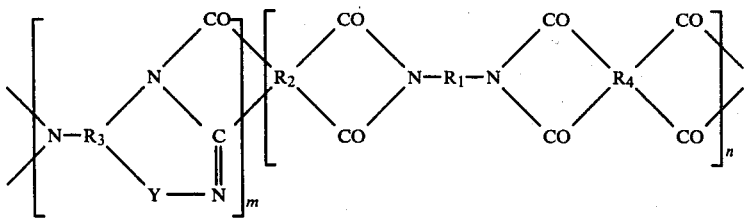

wherein $R_1$, $R_2$, $R_3$ and $R_4$ are multivalent aromatic groups, m and n are positive integers and Y is —CO— or —SO$_2$—. Such PIQ resins may be prepared by reacting an aromatic diamine, an aromatic acid dianhydride and an aromatic carbon amide or the like. Such resins and processes for preparing them are further described in Japanese Pat. No. 702,696 (Japanese Pat. Publication No. 48-2956).

Suitable specific examples of amine etchants suitable for use in the process and composition of this invention include n-propylamine, iso-butylamine, phenethylamine, and the like.

Suitable quaternary ammonium hydroxides for use in the process and composition of this invention have the formula

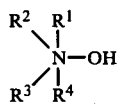

wherein $R^1$ and $R^2$ are the same or different alkyl groups containing 1 to 4 carbon atoms; $R^3$ is an alkyl group of 1 to 18 carbon atoms or an alkenyl group of 1 to 18 carbon atoms; and $R^4$ is an alkyl group of 1 to 18 carbon atoms, an alkenyl group of 1 to 18 carbons, phenyl, alkylphenyl, where the alkyl portion of the group has 1 to 18 carbon atoms, benzyl, or alkylbenzyl where the alkyl portion of the radical has 1 to 18 carbon atoms. Suitable specific examples of such quaternary ammonium hydroxides include the following:
tetramethyl ammonium hydroxide
tetraethyl ammonium hydroxide
tetrabutyl ammonium hydroxide
benzyl trimethyl ammonium hydroxide
phenyl trimethyl ammonium hydroxide
dodecyl trimethyl ammonium hydroxide
hexadecyl trimethyl ammonium hydroxide
octadecyl trimethyl ammonium hydroxide
dodecyl triethyl ammonium hydroxide
hexadecyl triethyl ammonium hydroxide
octadecyl triethyl ammonium hydroxide
dodecyl tri-n-propyl ammonium hydroxide
dodecyl tri-isopropyl ammonium hydroxide
benzyl dimethyl hexadecyl ammonium hydroxide
dimethyl ethyl hexadecyl ammonium hydroxide
p-dodecylbenzyl trimethyl ammonium hydroxide
benzyl dimethyl octadecyl ammonium hydroxide
Such quaternary ammonium hydroxides may be used either singly or as mixtures of two or more different quaternary ammonium hydroxides.

Suitable specific examples of N-alkyl pyrrolidinones for use with the quaternary ammonium hydroxides include N-methyl pyrrolidinone, N-ethyl pyrrolidinone, N-iso-propyl pyrrolidinone, N-butyl pyrrolidinone, and the like.

The two step partial curing process of this invention is operable with essentially any commercially available negative photoresist, such as Waycoat negative IC resist type 3, obtainable from Philip A. Hunt Chemical Corporation, Selectilux negative resist, obtainable from E. M. Merck Corporation, negative resists from Eastman Kodak Company or KTI Corporation under the designation 747, or the like. The process is also operable with positive photoresists, such as Shipley AZ1350H, AZ1350J, AZ1470, and AZ111, or the like. The etching compositions of this invention are operable with essentially any commercially available negative photoresist, including those listed above.

In addition to the etching compositions of this invention, if the novel two step partial curing process of this invention is used, conventional base etchants for the PI or PIQ layers are operable. Specific examples of such etchants include sodium hydroxide, potassium hydroxide, lithium hydroxide and ammonium hydroxide.

The following non-limiting examples describe the invention further.

EXAMPLE 1

The structure shown in FIG. 1 is prepared as follows: An aluminum metallized silicon semiconductor wafer with the aluminum metallization applied in accordance with conventional techniques used in the semiconductor industry is dehydration baked at 200° C. for twenty minutes. An organo-aluminum complex referred to as PIQ-coupler, obtained from Hitachi Chemical Company, is spin applied at 4000 RPM for 20 seconds to the semiconductor wafer. The PIQ-coupler is baked at 325° C. for 30 minutes to convert the coupler to $Al_2O_3$. A PIQ resin obtained from Hitachi Chemical Company and consisting of 15 weight percent of the PIQ resin in 85 weight percent N-methyl pyrrolidinone with a solution viscosity of 1200 centipoise is spin applied to the wafer at 4000 RPM for 20 seconds. The semiconductor wafer is placed flat in an oven and the PIQ resin layer is soft baked at 130° C. for 30 minutes to produce a first level of partial curing. A hexamethyldisilizane (HMDS) adhesion promoter is spin applied to the PIQ layer at 4000 RPM for 20 seconds.

A Waycoat negative IC resist type 3 having a viscosity of 59 centistokes, and obtained from Philip A. Hunt Chemical Corporation, is spin applied over the adhesion promotor at 3000 RPM for 20 seconds. The resist is then soft baked at 80° C. for 20 minutes. A pattern for forming 3, 10 and 50 micron square openings in the PIQ layer is aligned and used to expose the resist on a Perkin Elmer Model 140 projection aligner, with a setting of aperture 3, slit 1.0 and scan 400. The exposed photoresist is spray developed in xylene for 10 seconds, rinsed in N-butyl acetate for 10 seconds, and spin dried for 10 seconds at 5000 RPM. The developed photoresist layer is hard baked at 130° C. for 20 minutes.

The portions of the PIQ resin layer exposed by the openings in the resist layer are etched in an equimolar solution of phenethylamine and water for 40 to 50 seconds. The wafer is then rinsed in N-methyl pyrrolidinone for 20 seconds, followed by a water rinse and spin drying. The wafer is then baked for 30 minutes at 200° C. for further partial curing of the remaining portions of the PIQ resin layers.

The photoresist is then stripped with commercially available 712D organic photoresist stripper, obtained from EKC Technology, Inc., Hayward, Calif., at 90° C. for 20 minutes, followed by a methyl alcohol rinse for 30 seconds, a water rinse, and spin drying. Examination of the silicon wafer shows that complete removal of the photoresist has occurred with no attack of the partially cured portions of the PIQ resin layer. If the further partial curing of the PIQ layer after etching is not carried out, the photoresist stripper attacks the etched PIQ layer. If the etched PIQ layer is completely cured prior to photoresist stripping, the organic photoresist stripper will not produce complete removal of the photoresist.

The PIQ layer is then baked at 325° C. for 60 minutes, in order to complete its curing, followed by oxygen plasma descumming for two minutes at 450 watts in a plasma barrel asher.

Examination of the silicon wafer shows that the 3, 10 and 50 micron openings have been uniformly etched in the PIQ layer on the wafer, with no attack of the underlying aluminum layer. The openings have uniform 45° sloped sidewalls, with the etching for each size opening being completed at the same time, i.e., when the 3 micron holes have been completely opened, the 50 micron openings are not overetched. FIG. 1 shows a 10 micron square opening etched in accordance with this procedure and is drawn from a scanning electron microscope photograph of the semiconductor wafer after processing in the above manner.

FIGS. 2 and 3 show an important advantage obtained through use of the process and phenethylamine etching compositions of this invention. FIG. 2 shows aluminum interconnection metallurgy patterns 50 deposited and etched over conventional vapor deposited silicon dioxide layer 52 on an oxidized silicon substrate (not visible). The silicon dioxide layer 52 has sides 56 which form about a 90° angle with respect to its horizontal surface where it is deposited over underlying aluminum islands (not visible). As a result, when the aluminum metallization 50 is vacuum evaporated or sputter deposited on the oxide 52, sharp steps are formed at 58, where the aluminum metallization is deposited over the sides 56 and at 60, where there are openings in the oxide layer 52 down to the aluminum islands (not visible) to which contact is made by the interconnection metallurgy patterns. Such sharp steps 58 and 60 result in a thinning of the aluminum metallization at 62 where they occur, which results in an increased resistance where such thinning is present, and may even result in an open circuit, if there is a gap in the metallization at 58 or 60.

FIG. 3 shows similar aluminum metallization patterns 70 deposited over a PIQ resin layer 71, which has been etched using the two step partial PIQ curing process and the phenethylamine etchant composition of this invention to produce openings at 64 down to an underlying aluminum layer as in FIG. 2. Because the sidewalls of the PIQ resin layer at 68 have a 45° angle with respect to the underlying aluminum and oxidized silicon surfaces, no thinning of the metallization layers 70 occurs at opening 64. Also, there are gentle slopes at 66 in the PIQ layer 71 as a result of its deposition over the underlying aluminum islands (not visible). Because the phenethylamine etchants used in the composition and process of this invention produce such a 45° slope on the walls at 68, and there are no sharp steps at 66, no thinning of the aluminum metallization patterns 70 occurs at these points. The patterns 70 have the same shape as the patterns 50 in FIG. 2, but the foreshortening effect of the scanning electron microscope photographs from which FIGS. 2 and 3 are drawn produces an apparent difference in shape.

EXAMPLE 2

The following additional steps are carried out with the silicon wafer utilized in Example 1 to produce the structure shown in FIG. 3: a titanium-tungsten alloy underlayer is sputter deposited to a thickness of 1200 angstroms on the wafer. The titanium-tungsten alloy surface is scrubbed with a water jet, and a 1.5 micron thick aluminum layer is vacuum evaporated with a Varian electron beam evaporator at 220° C. The aluminum and titanium-tungsten alloy layers are masked and etched in a conventional manner with an aqueous mixture of phosphoric acid and acetic acid to give the pattern shown in FIG. 3. Because the PIQ layer 71 corresponding to the silicon dioxide layer 52 of FIG. 2 has a 45° slope on sidewalls 68 and a gentle slope at 66, in contrast to the 90° edges at 58 and 60 in FIG. 2, there is no thinning of the overlying aluminum metallization 70 at those edges as occurs in the conventional FIG. 2 structure.

EXAMPLE 3

The procedure of Example 1 is repeated except that the rinse in N-methyl pyrrolidinone is replaced with a rinse in 1,2(bismethoxyethoxy)ethane for 15 seconds, followed by a rinse in methyl alcohol for 15 seconds. Equivalent results are obtained.

EXAMPLE 4

The procedure of Example 1 is repeated, except that the aqueous phenethylamine etchant soluton for the PIQ layer is replaced with an etchant mixture of equal parts by volume of N-methyl pyrrolidinone and aqueous 5 percent by weight tetramethylammonium hydroxide, and the etching is carried out for between 50 and 60 seconds. With this etchant solution, the N-methyl pyrrolidinone rinse utilized in Example 1 is omitted, and only a water rinse is carried out after etching. The sidewalls of the resulting etched PIQ layer are sloped, with an angle between 60° and 65°. Completion of etching the 3, 10 and 50 micron square openings in the PIQ layer is simultaneous, i.e., no overetching of the 50 micron openings has occured at completion of the etching of the 3 micron openings. Since this etchant will attack underlying aluminum, it is important that overetching not take place.

EXAMPLE 5

The procedure of Example 1 is repeated, except that the soft bake of the PIQ resin layer is carried out at 140° C. for 30 minutes, and an equimolar solution of n-propylamine and water is substituted for the aqueous phenethylamine solution of Example 1, with an etch time of 5 seconds. The n-propylamine etchant forms the 3, 10 and 50 micron square openings in the PIQ layer with 90° straight sidewalls, with no attack on the underlying aluminum layer. The completion of etching for the different size openings is simultaneous, i.e., no overetching of the 50 micron openings is observed when the etching of the 3 micron openings is complete. Such a 90° straight sidewall for the openings is useful when it is desired to employ an etched PIQ layer as a mask for ion implantation, due to the sharp edge definition obtained.

Substitution of commercially available Pyre-ML resin, obtained from E. I. DuPont de Nemours & Company, in equivalent amounts for the PIQ resin employed in the above examples gives similar advantageous results.

It should now be apparent to those skilled in the art that a novel etching process and etching composition capable of achieving the stated objects of the invention has been provided. The two step partial curing process allows negative photoresist to be used for defining areas where a PI or PIQ resin is to be etched. The subsequent use of organic photoresist strippers for removing the remaining photoresist from the PI or PIQ layers does not attack those layers. The amine etchants and quaternary ammonium hydroxide N-alkyl pyrrolidinone etching compositions of this invention will produce openings with a 45° slope on their sidewalls, 90° straight sidewalls, or a 60°-65° slope on their sidewalls, with close control over opening geometry and simultaneous etch completion of different size openings in each case. As a result, these etching compositions replace such hazardous materials as hydrazine or hot bases for etching PI and PIQ insulating layers in the fabrication of integrated circuits and other semiconductor devices.

It should further be apparent to those skilled in the art that various changes in form and details of the invention as shown and described may be made. It is intended that such changes be included within the spirit and scope of the claims appended hereto.

What is claimed is:

1. A process for fabricating a semiconductor device having a patterned polyimide or polyimide-iso-indroquinazolinedione insulating layer on said device, comprising applying a layer of uncured polyimide or polyimide-iso-indroquinazolinedione resin on a surface of said device, heating said resin layer to produce a first level of partial curing in said resin layer, applying a photoresist layer to said partially cured resin layer, developing said photoresist layer to uncover said partially cured resin layer where it is to be removed, etching said partially cured resin layer to produce said patterned layer, heating said patterned layer to produce a second level of partial curing which is sufficient to prevent organic photoresist strippers from attacking the patterned layer, stripping the developed photoresist with an organic photoresist stripper, and heating said patterned layer a sufficient extent to complete the curing of said polyimide or polyimide-iso-indroquinazolinedione resin.

2. The process of claim 1 in which said heating to produce the first level of partial curing in said resin layer is at a temperature of from about 120° to about 150° C., for a time sufficient to remove solvent from said resin.

3. The process of claim 2 in which said heating to produce the second level of curing in said patterned layer is carried out at a temperature of about 180° C. to about 220° C.

4. The process of claim 3 in which the curing of said patterned layer is completed at a temperature of at least about 300° C.

5. The process of claim 1 in which said photoresist layer is a negative photoresist.

6. A process for fabricating a semi-conductor device having a patterned polyimide or polyimide-iso-indroquinazoline-dione insulating layer on a surface of said device, comprising applying a layer of uncured polyimide or polyimide-iso-indroquinazolindione insulating resin on a surface of said device, heating said resin layer to produce partial curing in said resin layer, applying a layer of photoresist to said partially cured resin layer, developing said photoresist layer to uncover said partially cured resin layer, etching said partially cured resin layer with an amine etchant having the formula R—CH2—CH2—NH2, wherein R is an alkyl group having from 1 to 4 carbon atoms or an aryl group having from 6 to 12 carbon atoms, the amine etchant being provided in substantially equimolar solution with water, or an etchant comprising a mixture of a quaternary ammonium hydroxide and an N-alkyl pyrrolidinone, the quaternary ammonium hydroxide and N-alkyl pyrrolidinone etchant being provided as substantially equal parts by volume of a solution containing from about 1 to about 10 weight percent quaternary ammonium hydroxide in water and the N-alkyl pyrrolidinone.

7. The process of claim 6 in which R is a methyl group.

8. The process of claim 6 in which R is a phenyl group.

9. The process of claim 8 in which said etching is followed by rinsing in a lower alkyl bisalkoxyalkane or alkanol.

10. The process of claim 6 in which the quaternary ammonium hydroxide is tetramethylammonium hydroxide.

11. The process of claim 10 in which the N-alkyl pyrrolidinone is N-methyl pyrrolidinone.

12. An etchant solution for etching patterns in a polyimide or polyimide-iso-indroquniazolinedione insulating layer on a semiconductor device, which comprises a solution of substantially equal parts by volume of about 1.0 to about 10 weight percent of a quaternary ammonium hydroxide in water and about 40 to 60 weight percent of an N-alkyl pyrrolidinone.

13. The etchant solution of claim 12 in which said N-alkyl pyrrolidinone is N-methyl pyrrolidinone.

14. The etchant solution of claim 13 in which said quaternary ammonium hydroxide is tetramethylammonium hydroxide.

15. An etchant solution for etching patterns in a polyimide or polyimide-iso-indroquinazolinedione insulating layer on a semiconductor device, which comprises substantially equimolar proportions of an amine having the formula R—CH$_2$—CH$_2$—NH$_2$, wherein R is an alkyl group having from 1 to 4 carbon atoms or an aryl group having from 6 to 12 carbon atoms, and water.

16. The etchant solution of claim 15 in which R is a methyl or a phenyl group.

17. The process of claim 6 additionally comprising the steps of heating the partially cured resin layer after the etching step to produce a second level of partial curing in said resin layer which is sufficient to prevent organic photoresist strippers from attacking the patterned layer, stripping the developed photoresist layer with an organic photoresist stripper, and heating said patterned layer a sufficient extent to complete the curing of said polyimide or polyimide-iso-indroquinazolinedione resin.

* * * * *